United States Patent
Yamazaki et al.

(10) Patent No.: US 6,965,810 B2
(45) Date of Patent: Nov. 15, 2005

(54) MACHINING SIMULATION MACHINE

(75) Inventors: Tsunehiko Yamazaki, Aichi-ken (JP); Naoomi Miyagawa, Gifu-ken (JP)

(73) Assignee: Yamazaki Mazak Kabushiki Kaisha, Aichi-ken (JP)

( * ) Notice: Subject to any disclaimer, the term of this patent is extended or adjusted under 35 U.S.C. 154(b) by 14 days.

(21) Appl. No.: 11/062,067

(22) Filed: Feb. 18, 2005

(65) Prior Publication Data

US 2005/0187652 A1    Aug. 25, 2005

(30) Foreign Application Priority Data

Feb. 24, 2004  (JP)  ............................. 2004-048261

(51) Int. Cl.⁷ ............................................. G06F 19/00
(52) U.S. Cl. ................. 700/182; 700/173; 219/121.78; 318/561
(58) Field of Search ............................... 700/173, 175, 700/177, 182, 179; 318/561, 563, 565, 568.24, 318/568.25; 219/121.61, 121.67, 121.6, 121.78; 701/150

(56) References Cited

U.S. PATENT DOCUMENTS 5,340,962 A * 8/1994 Schmidt et al. ........ 219/121.78
5,808,432 A * 9/1998 Inoue et al. ................. 700/175
6,671,600 B1 * 12/2003 Hintzy ........................ 701/50

* cited by examiner

*Primary Examiner*—Kidest Bahta
(74) *Attorney, Agent, or Firm*—Duane Morris LLP

(57) ABSTRACT

A model producing means for modeling a chip model at an edge of a solid model of a nozzle through a predetermined space in a three-dimensional virtual space, and a trace machining propriety judging means for watching a state of an interference between the chip model and the solid model of a workpiece at the time of simulation of laser beam machining program and outputting a predetermined signal when releasing the state of the interference are provided. If an inconvenient instruction wherein the nozzle and the workpiece do not face each other is included in the laser beam machining program, the chip model departs from the solid model of the workpiece and the trace machining propriety judging means outputs a predetermined signal, through which program error can be properly detected with no visual observation of an operator.

12 Claims, 4 Drawing Sheets

MACHINING SIMULATION MACHINE

BACKGROUND OF THE INVENTION

The invention relates to a machining simulation machine for inspecting a program error by simulating a laser beam machining program. Especially, the invention relates to a machining simulation machine for judging propriety of contents of trace machining in the laser beam machining program wherein trace machining is instructed.

In a conventional machining simulation machine for simulating machining program of machining with laser beam, various kinds of functions for inspecting a program error have been developed. But, most part of this inspection still depends on visual observation of an operator, and then automation of such inspection is desired.

In the trace machining wherein a torch for emitting laser beam is moved, keeping a constant distance from a surface of a workpiece, a state of moving the torch, keeping a constant distance with respect to the surface of the workpiece which is designated in the machining program is computed at the time of simulation, and the state can be simulated on a display. But, an inspection as to whether or not an instruction of trace movement of the torch with respect to the workpiece to be machined is proper depends on visual observation of an operator.

Applicant does not know prior art for disclosing inspection as to whether or not an instruction of trace movement of the torch with respect to the workpiece to be machined is proper at the time of simulation of the trace machining in the laser beam machining program.

Under these circumstances, an operator is required to have a high level of knowledge of the trace machining when inspecting machining program, and in addition, to watch a state of moving the torch displayed on a display with high level of attention. That is, an operator is required to shoulder excessive burden.

Then, developments of the machining simulation machine for inspecting as to whether or not an instruction of trace movement of the torch with respect to the workpiece to be machined is proper in the laser beam machining program including trace machining on a machine side without depending visual observation of an operator are still desired.

SUMMARY OF THE INVENTION

One aspect of the invention is machining simulation machine for displaying a state of movement of a nozzle with respect to a workpiece which is instructed by a laser beam machining program on a display means by simulating said laser beam machining program, comprising:
- a modeling means for modeling solid models of said workpiece and said nozzle to be used for machining with laser beam in a three-dimensional virtual space;
- said modeling means having a chip model producing means for modeling a chip model at an edge of said solid model of said nozzle produced in said three-dimensional virtual space through a predetermined space;
- a simulation execution means for controlling to move said solid model of said nozzle with respect to said solid model of said workpiece together with said chip model in said three-dimensional virtual space according to an instruction of said laser beam machining program; and
- a trace machining propriety judging means for watching a state of an interference between said chip model and said solid model of said workpiece, and outputting a predetermined signal when said state of said interference being released.

According to this aspect of the invention, the chip model producing means produces the chip model at an edge of the solid model of the nozzle through a predetermined space, and the trace machining propriety judging means watches the state of the interference between the chip model and the solid model of the workpiece at the time of simulation by the simulation execution means and outputs a predetermined signal when releasing the interference state. Even if a instruction inconvenient for the trace machining wherein the nozzle and the workpiece do not face each other is included in the laser beam machining program, the chip model departs from the solid model of the workpiece at the time of simulation and the trace machining propriety judging means detects this inconvenient state and outputs a predetermined signal, so that the program error can be properly detected with no visual observation of an operator.

Another aspect of the invention is the machining simulation machine, wherein a trace machining instruction judging means for judging whether or not trace machining is instructed in said laser beam machining program is provided, and said trace machining propriety judging means watches said state of said interference between said chip model and said solid model of said workpiece only when said trace machining instruction judging means judges that said trace machining is instructed in said laser beam machining program.

According to this aspect of the invention, the trace machining propriety judging means watches the state of the interference between the chip model and the solid model of the workpiece only when the trace machining instruction judging means judges that the trace machining is instructed in the laser beam machining program, so that it is possible to execute an operation of detecting the propriety of the instruction of the trace machining in the laser beam machining program only in the case where the trace machining is judged to be instructed in the laser beam machining program, thereby effectively simulating with no vain computation.

Another aspect of the invention is the machining simulation machine, wherein said chip model producing means models a virtual object for connecting said solid model of said nozzle and said chip model therebetween.

According to this aspect of the invention, an operator can easily understand the relation between the chip model and the solid model of the nozzle by modeling this virtual object.

Another aspect of the invention is the machining simulation machine, wherein said virtual object is modeled in the shape of an elongate bar.

According to this aspect of the invention, the virtual object is modeled in the shape of an elongate bar, so that the virtual object can be modeled so as to have the shape different from the chip model and the solid model of the nozzle, thereby the chip model and the solid model of the nozzle which are connected with each other through the virtual object can be easily visually differentiated from each other.

Another aspect of the invention is the machining simulation machine, wherein said chip model producing means forms said virtual object such that a space between said solid model of said nozzle and said chip model has a dimension corresponding to a space to be kept between said workpiece and said nozzle in said trace machining which is instructed in said laser beam machining program.

According to this aspect of the invention, the virtual object is formed such that the distance between the solid model of the nozzle and the chip model has a dimension corresponding to the space between the workpiece and the nozzle to be kept in the trace machining which is instructed in the laser beam machining program, so that the space between the workpiece and the nozzle to be kept in the trace machining can be visually perceived at the time of simulation.

Another aspect of the invention is the machining simulation machine, wherein a warning means for warning that said instruction of said trace machining in said laser beam machining program is improper when said trace machining propriety judging means outputs said predetermined signal is provided.

According to this aspect of the invention, the warning means warns that the instruction of the trace machining in the laser beam machining program is improper, so that an operator can immediately perceive the propriety of the laser beam machining program through the display means.

DESCRIPTION OF THE PREFERRED EMBODIMENTS

Figure 1:
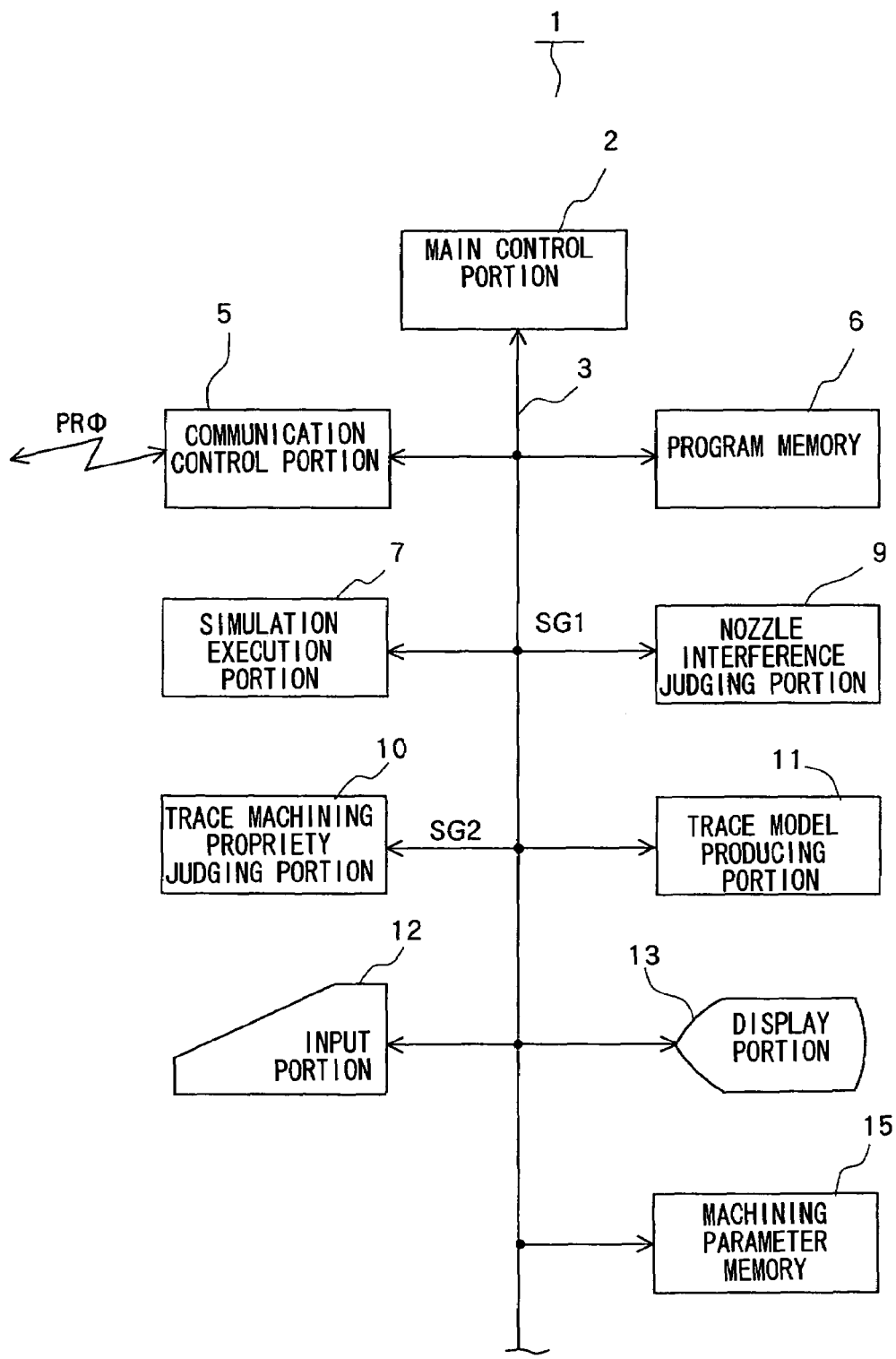
FIG. 1 is a control block diagram showing a machining simulation machine.
Figure 2:
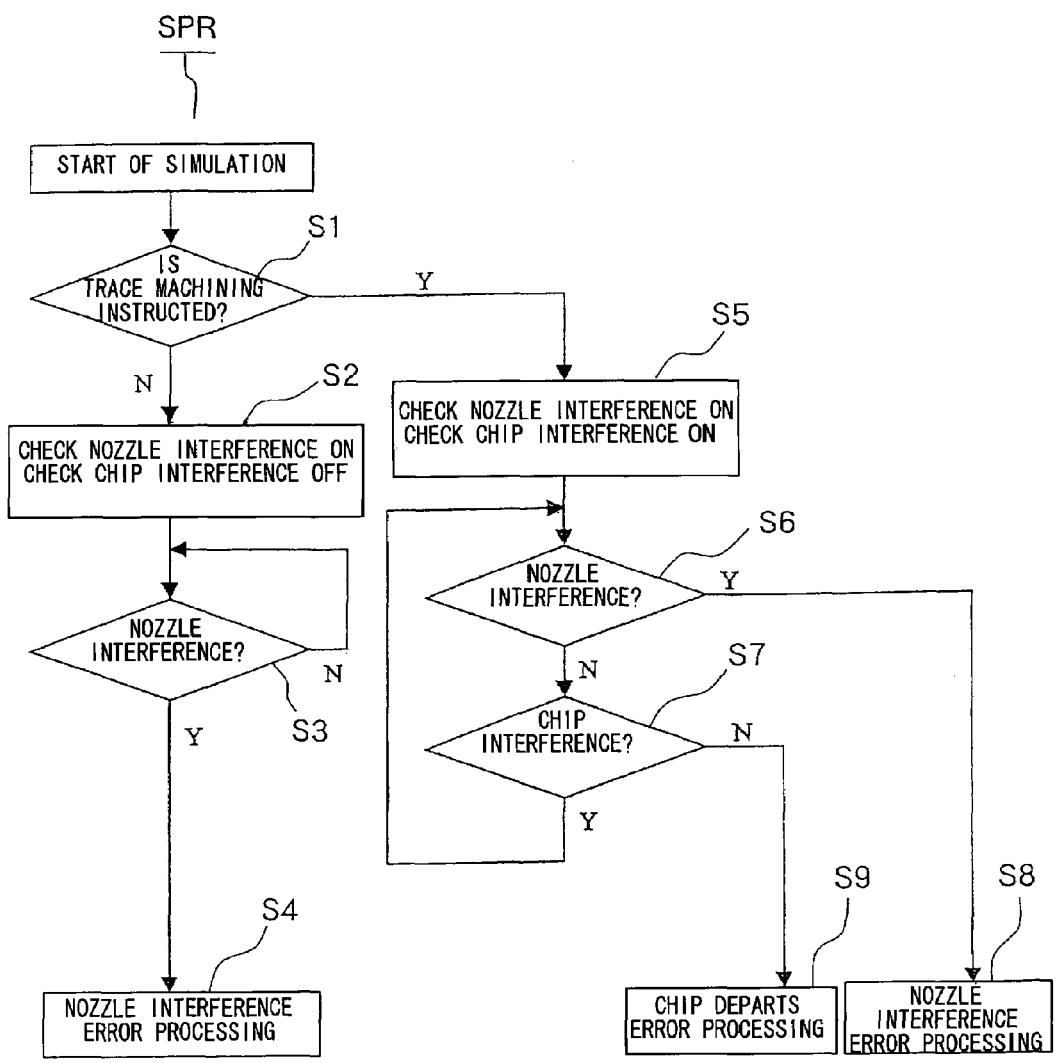
FIG. 2 is a flow chart showing simulation control program.
Figure 3:
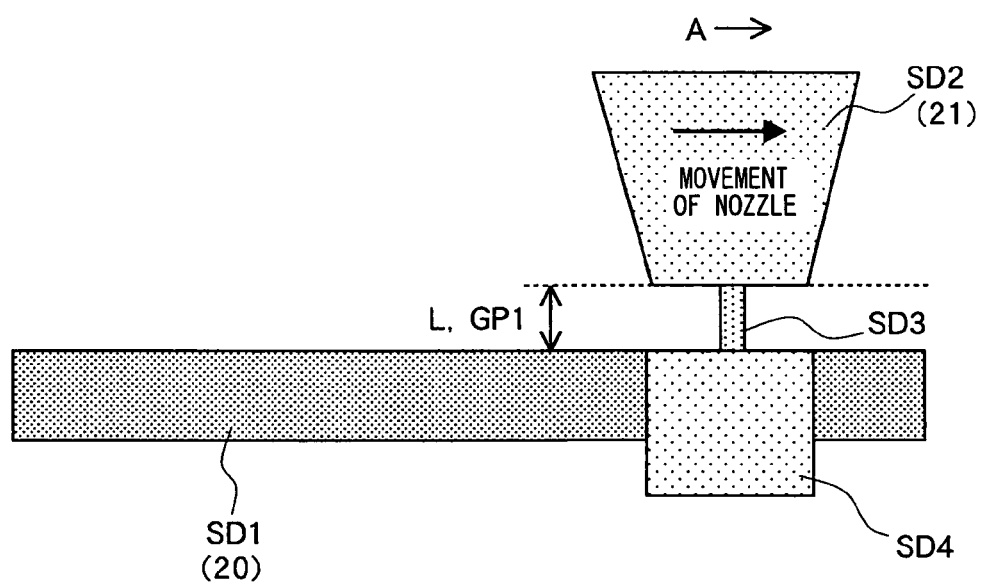
FIG. 3 is a view showing a positional relation between a machining torch and a workpiece in a three-dimensional virtual space constructed by a simulation execution portion, the positional relation being computed according to simulation control program, and is a view showing a normal trace control state.
Figure 4:
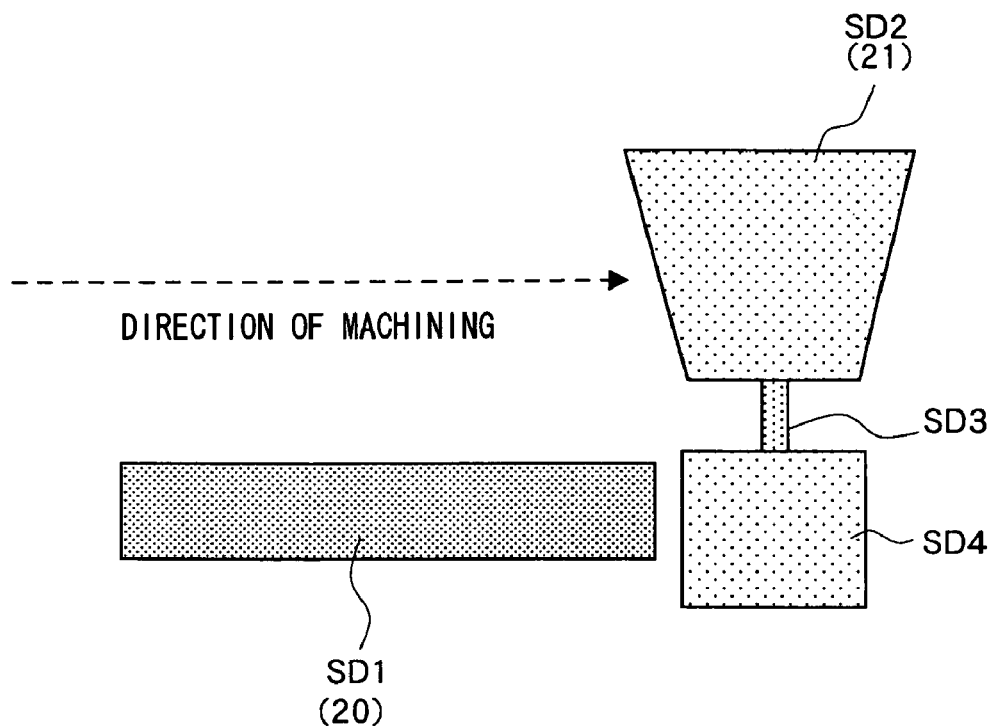
FIG. 4 is a view showing the positional relation between the machining torch and the workpiece in the three-dimensional virtual space constructed by the simulation execution portion, the positional relation being computed according to the simulation control program, and is a typical view showing a state wherein an instruction of trace movement of the torch with respect to the workpiece to be machined is improper.

FIG. 1 is a control block diagram showing a machining simulation machine, FIG. 2 is a flow chart showing simulation control program, FIG. 3 is a view showing a positional relation between a machining torch and a workpiece in a three-dimensional virtual space constructed by a simulation execution portion, the positional relation being computed according to simulation control program, and is a view showing a normal trace control state, and FIG. 4 is a view showing the positional relation between the machining torch and the workpiece in the three-dimensional virtual space constructed by the simulation execution portion, the positional relation being computed according to the simulation control program, and is a typical view showing a state wherein an instruction of trace movement of the torch with respect to the workpiece to be machined is improper.

A machining simulation machine 1 has a main control portion 2, as shown in FIG. 1. A communication control portion 5, a program memory 6, a simulation execution portion 7, a nozzle interference judging portion 9, a trace machining propriety judging portion 10, a trace model producing portion 11, an input portion 12, a display portion 13, and a machining parameter memory 15 are connected with the main control portion 2 through a bus line 3.

The machining simulation machine 1 has the above-mentioned structure, and a laser beam machining program PRO which is composed outside is on-line inputted in the communication control portion 5 of the machining simulation machine 1 through a communication line, such as the LAN. The method of inputting the laser beam machining program PRO is not only through the communication line, but may be that the laser beam machining program PRO is stored in a proper storage medium, such as a magnetic disc, and the storage medium storing the laser beam machining program PRO therein is set on an outside data input portion which is connected with the machining simulation machine 1 so as to read out the program PRO.

The laser beam machining program PRO thus inputted is stored in the program memory 6. When an operator inputs an instruction of execution of simulation through the input portion 12, the main control portion 2 instructs the trace model producing portion 11 to produce trace models of a workpiece 20 and a nozzle 21.

Receiving this instruction, the trace model producing portion 11 produces a solid model SD1 of the workpiece having a predetermined thickness in a three-dimensional virtual space according to a shape of a material of the worpiece which is designated in the laser beam machining program PRO, and reads a three-dimensional shape of the nozzle 21 which is used at the time of machining on the workpiece 20 out of the machining parameter memory 15 and produces a solid model SD2 of the nozzle 21 in the three-dimensional virtual space in a similar way, as shown in FIG. 3.

When producing the solid model SD2 of the nozzle 21, the trace model producing portion 11 produces the solid model SD2 having a dimensional shape suitable for the shape of the nozzle 21 to be used for an actual machining, and a chip model SD4, a predetermined space GP1 away from the solid model SD2 in the lower hand of the nozzle 21 in FIG. 3, that is, in a direction where the nozzle 21 emits laser beam, through a connecting bar model SD3 which is a virtual object so as to move together with the solid model SD2 of the nozzle 21. The size of the chip model SD4 is optional, but preferably, the connecting bar model SD3 has the shape different from the chip model SD4 and the solid model SD2 of the nozzle so that both models SD4 and SD2 can be differentiated from each other. In a case of FIG. 3, the connecting bar model SD3 has an elongate bar shape having a small diameter.

After thus producing the solid models SD1, SD2 of the workpiece and the nozzle and the connecting bar model SD3 and the chip model SD4 in the three-dimensional virtual space, the main control portion 2 instructs the simulation execution portion 7 to execute simulation according to the laser beam machining program PRO. Receiving this instruction, the simulation execution portion 7 executes a machining instruction stored in the laser beam machining program PRO so that the solid models SD1, SD2 of the workpiece and the nozzle which were produced in the three-dimensional virtual space are objects to be controlled, and then, simulation of moving the solid model SD2 of the nozzle to the solid model SD1 of the workpiece is executed in the three-dimensional virtual space. At this time, the connecting bar model SD3 and the chip model SD4 are also controlled to be moved in the three-dimensional virtual space together with movement of the solid model SD2 of the nozzle.

The positional relation between the nozzle and the workpiece in the three-dimensional virtual space after executing the laser beam machining program PRO is represented by rendering the solid models SD1, SD2 from predetermined positions in the three-dimensional virtual space, and displaying the rendered on the display portion 13. This representation is displayed as an image in such a manner that the solid model SD2 of the nozzle is moved, for the solid model SD1 of the workpiece together with the connecting bar model SD3 and the chip model SD4 in a direction of a movement instructed by the laser beam machining program PRO, such as an arrow A direction as shown in FIG. 3.

Keeping an eye on a state of the image displayed on the display portion 13, an operator watches as to whether or not there is an error in the laser beam machining program PRO. The simulation execution portion 7 thus executes simulation of the laser beam machining program PRO. At the time of the simulation of the laser beam machining program PRO, the simulation execution portion 7 reads a simulation control program SPR as shown in FIG. 2 out of the program memory 6, and controls the simulation in the three-dimensional virtual space according to the simulation control program SPR.

That is, the main control portion 2 judges as to whether or not trace machining is instructed in the laser beam machining program PRO during the simulation by interpreting contents of respective instructions of the laser beam machining program PRO in Step S1 of the simulation control program SPR. If no trace machining is judged to be instructed, the program SPR enters in Step S2, and a first operation of judging an interference of the nozzle is executed, putting the operation of judging the interference between the solid model SD2 of the nozzle and the solid model SD1 of the workpiece ON and the operation of judging the interference between the chip model SD4 and the solid model SD1 of the workpiece OFF.

The first operation of judging an interference of the nozzle is one of judging only interference between the workpiece and the nozzle. The simulation execution portion 7 gets the nozzle interference judging portion 9 to judge only as to whether or not the solid model SD2 of the nozzle interferes with the solid model SD1 of the workpiece in Step S3 of the simulation control program SPR.

The solid model SD2 of the nozzle is controlled to be moved in the three-dimensional virtual space according to the laser beam machining program PRO. If there is an error in the laser beam machining program PRO and the nozzle and the workpiece interfere with each other in the instruction in the program PRO, the solid models SD1, SD2 of the workpiece and the nozzle interfere with each other in the three-dimensional virtual space, so that a program error is judged by checking this interference. When the interference between the solid models SD1, SD2 of the workpiece and the nozzle in the three-dimensional virtual space is judged in Step S3, the nozzle interference judging portion 9 outputs a nozzle interference signal SG1 to the main control portion 2. Receiving this signal, program enters in Step S4, and the main control portion 2 informs an operator that the workpiece and the nozzle will interfere with the contents of the instruction of the present laser beam machining program PRO through the display portion 13.

If the main control portion 2 judges that the trace machining has been instructed in the laser beam machining program PRO during the simulation according to Step S1 of the simulation control program SPR, the program enters in Step S5, and a second operation of judging an interference of the nozzle is executed, putting the operation of judging the interference between the solid model SD2 of the nozzle and the solid model SD1 of the workpiece ON and also the operation of judging the interference between the chip model SD4 and the solid model SD1 of the workpiece ON.

In this second operation of judging the interference of the nozzle, the trace model producing portion 11 sets the length L of the connecting bar model SD3, that is, the distance between the solid model SD2 of the nozzle and the chip model SD4 so as to have a dimension corresponding to a space GP1 to be kept between the workpiece and the nozzle in the trace machining instructed in the laser beam machining program PRO in the three-dimensional virtual space.

The second operation of judging the interference of the nozzle is one of judging as to whether or not the trace machining of the workpiece is properly programmed in addition to judgment of the interference between the workpiece and the nozzle. Then, the simulation execution portion 7 gets the nozzle interference judging portion 9 to judge as to whether or not the solid model SD2 of the nozzle interferes with the solid model SD1 of the workpiece in Step S6 of the simulation control program SPR. At the same time, the simulation execution portion 7 gets the trace machining propriety judging portion 10 to watch and judge whether or not an interference state between the chip model SD4 and the solid model SD1 of the workpiece is maintained in Step S7 of the simulation control program SPR.

That is, the solid model SD2 of the nozzle is controlled to be moved in the three-dimensional virtual space according to the laser beam machining program PRO. If there is an error in the laser beam machining program PRO and interference between the nozzle and the workpiece is instructed, the solid models SD1, SD2 of the workpiece and the nozzle are interfered in the three-dimensional virtual space, thereby judging the program error by checking this interference.

If the interference between the solid models SD1 and SD2 of the workpiece and the nozzle in the three-dimensional virtual space is judged in Step S6, the nozzle interference control portion 9 outputs the nozzle interference signal SG1 to the main control portion 2. Receiving this signal, the program enters in Step S8, and the main control portion 2 executes error processing of informing an operator through the display portion 13 that the workpiece and the nozzle interfere with each other with the contents of the present laser beam machining program PRO.

The nozzle interference judging portion 7 judges the interference between the nozzle and the workpiece, and simultaneously, the trace machining propriety judging portion 10 judges whether or not the instruction of the trace machining is proper with the simulation. If the trace machining has been also instructed to a position outside the workpiece in the laser beam machining program PRO, the solid model SD2 of the nozzle departs from the upper portion of the solid model SD1 of the workpiece as shown in FIG. 4 and goes to a right hand of FIG. 4, and at the same time, the chip model SD4 connected through the connecting bar model SD3 also departs from the solid model SD1 of the workpiece, so as to release the interference state between the solid model SD1 of the workpiece and the chip model SD3.

If the trace machining in the laser beam machining program PRO has been improperly instructed to the position outside the workpiece 20 also, the nozzle 21 is unlimitedly moved and driven in the lower hand of FIG. 4 for catching the workpiece in an actual machining on the basis of a property of the trace machining control wherein the distance between the nozzle and the workpiece to be in the lower hand of FIG. 4 (that is, a direction where the nozzle 21 emits laser beam) is constantly maintained, so that an inconvenient accident, such as collision between the nozzle 21 and the other mechanical portion, such as the workpiece 20 and a table of the laser beam machine, may occur.

Then, the trace machining propriety judging portion 10 always checks the interference between the solid model SD1 of the workpiece and the chip model SD4 in Step S7 if the trace machining is instructed in the laser beam machining program PRO. When keeping the interference, the trace machining propriety judging portion 10 judges that the nozzle is moved with respect to the workpiece through the proper space GP1 determined by the connecting bar model SD3 in the instruction. When judging release of the interference between the solid model SD1 of the workpiece and the chip model SD4 in Step S7, that is, no interference between the solid model SD1 of the workpiece and the chip model SD4 as shown in FIG. 4, on the contrary, the nozzle is judged to lose the workpiece for continuing trace machining, and the trace machining propriety judging portion 10 outputs a predetermined trace fail signal SG2 to the main control portion 2. Receiving this signal, the program enters in Step S9, and the main control portion 2 executes error processing by informing an operator through the display portion 13 that the present instruction of the trace machining in the laser beam machining program PRO is improper, so the nozzle is moved to the position outside the workpiece with the contents of the present instruction, so that the proper trace machining is impossible.

An operator thus properly perceives whether or not the trace machining is properly instructed in the laser beam machining program PRO by the simulation.

It is not always necessary to display the connecting bar model SD3 and the chip model SD4 on the display portion 13 during the simulation. But, the interference between the chip model SD4 and the solid model SD1 of the workpice may be internally watched without displaying the connecting bar model SD3 and the chip model SD4 on the display portion 13, and the trace machining propriety judging portion 10 may output the predetermined trace fail signal SG2 to the main control portion 2 when no interference between the solid model SD1 of the workpiece and the chip model SD4 being judged as shown in FIG. 4, and receiving this signal, the main control portion 2 may inform an operator through the display portion 13 that the present instruction of the trace machining in the laser beam machining program PRO is improper, so the nozzle is moved to the position outside the workpiece with the contents of the present instruction, so that the proper trace machining is impossible.

Furthermore, the connecting bar model SD3 having an optional shape can be adopted. But, preferably, the connecting bar model SD3 has a dimensional shape different from the solid model SD2 of the nozzle and the chip model SD4 so as to differentiate the solid model SD2 and the chip model SD4 from each other when displaying the image of the simulation on the display portion 13 during the simulation.

The present invention has been explained on the basis of the example embodiments discussed. Although some variations have been mentioned, the embodiments which are described in the specification are illustrative and not limiting. The scope of the invention is designated by the accompanying claims and is not restricted by the descriptions of the specific embodiments. Accordingly, all the transformations and changes within the scope of the claims are to be construed as included in the scope of the present invention.

What is claimed is:

1. Machining simulation machine for displaying a state of movement of a nozzle with respect to a workpiece which is instructed by a laser beam machining program on a display means by simulating said laser beam machining program, comprising:
   a modeling means for modeling solid models of said workpiece and said nozzle to be used for machining with laser beam in a three-dimensional virtual space;
   said modeling means having a chip model producing means for modeling a chip model at an edge of said solid model of said nozzle produced in said three-dimensional virtual space through a predetermined space;
   a simulation execution means for controlling to move said solid model of said nozzle with respect to said solid model of said workpiece together with said chip model in said three-dimensional virtual space according to an instruction of said laser beam machining program; and
   a trace machining propriety judging means for watching a state of an interference between said chip model and said solid model of said workpiece, and outputting a predetermined signal when said state of said interference being released.

2. The machining simulation machine according to claim 1, wherein a trace machining instruction judging means for judging whether or not trace machining is instructed in said laser beam machining program is provided, and said trace machining propriety judging means watches said state of said interference between said chip model and said solid model of said workpiece only when said trace machining instruction judging means judges that said trace machining is instructed in said laser beam machining program.

3. The machining simulation machine according to claim 1, wherein said chip model producing means models a virtual object for connecting said solid model of said nozzle and said chip model therebetween.

4. The machining simulation machine according to claim 3, wherein said virtual object is modeled in the shape of an elongate bar.

5. The machining simulation machine according to claim 3, wherein said chip model producing means forms said virtual object such that a space between said solid model of said nozzle and said chip model has a dimension corresponding to a space to be kept between said workpiece and said nozzle in said trace machining which is instructed in said laser beam machining program.

6. The machining simulation machine according to claim 1, wherein a warning means for warning that said instruction of said trace machining in said laser beam machining program is improper when said trace machining propriety judging means outputs said predetermined signal is provided.

7. Machining simulation machine for displaying a state of movement of a nozzle with respect to a workpiece which is instructed by a laser beam machining program on a display unit by simulating said laser beam machining program, comprising:
   a modeling unit for modeling solid models of said workpiece and said nozzle to be used for machining with laser beam in a three-dimensional virtual space;
   said modeling unit having a chip model producing unit for modeling a chip model at an edge of said solid model of said nozzle produced in said three-dimensional virtual space through a predetermined space;
   a simulation execution unit for controlling to move said solid model of said nozzle with respect to said solid model of said workpiece together with said chip model in said three-dimensional virtual space according to an instruction of said laser beam machining program; and a trace machining propriety judging unit for watching a state of an interference between said chip model and said solid model of said workpiece, and outputting a predetermined signal when said state of said interference being released.

8. The machining simulation machine according to claim 7, wherein a trace machining instruction judging unit for judging whether or not trace machining is instructed in said laser beam machining program is provided, and said trace machining propriety judging unit watches said state of said interference between said chip model and said solid model of said workpiece only when said trace machining instruction judging unit judges that said trace machining is instructed in said laser beam machining program.

9. The machining simulation machine according to claim 7, wherein said chip model producing unit models a virtual object for connecting said solid model of said nozzle and said chip model therebetween.

10. The machining simulation machine according to claim 9, wherein said virtual object is modeled in the shape of an elongate bar.

11. The machining simulation machine according to claim 9, wherein said chip model producing unit forms said virtual object such that a space between said solid model of said nozzle and said chip model has a dimension corresponding to a space to be kept between said workpiece and said nozzle in said trace machining which is instructed in said laser beam machining program.

12. The machining simulation machine according to claim 7, wherein a warning unit for warning that said instruction of said trace machining in said laser beam machining program is improper when said trace machining propriety judging unit outputs said predetermined signal is provided.

* * * * *